US008492795B1

(12) United States Patent
Chen

(10) Patent No.: US 8,492,795 B1
(45) Date of Patent: Jul. 23, 2013

(54) INTEGRATED CIRCUIT HAVING INPUT/OUTPUT CELL ARRAY HAVING SINGLE GATE ORIENTATION

(75) Inventor: Ker-Min Chen, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/433,006

(22) Filed: Mar. 28, 2012

Related U.S. Application Data

(60) Provisional application No. 61/593,110, filed on Jan. 31, 2012.

(51) Int. Cl.
*H01L 27/10* (2006.01)
*G03C 1/00* (2006.01)

(52) U.S. Cl.
USPC ............................ 257/203; 257/202; 326/101

(58) Field of Classification Search
USPC ................. 257/202–207, 370, 390, 443, 494, 257/495, 691, 773, 784, 786, 923, 925; 326/86, 326/101
See application file for complete search history.

(56) References Cited

U.S. PATENT DOCUMENTS

| | | | | |
|---|---|---|---|---|
| 6,836,026 B1 * | 12/2004 | Ali et al. | | 257/786 |
| 7,910,956 B2 * | 3/2011 | Hosomi | | 257/203 |
| 8,183,599 B2 * | 5/2012 | Hosomi | | 257/203 |

* cited by examiner

*Primary Examiner* — Vibol Tan
(74) *Attorney, Agent, or Firm* — Lowe Hauptman Ham & Berner, LLP

(57) ABSTRACT

An integrated circuit (IC) including a core area containing active devices and at least one input/output (I/O) cell configured to transfer signals into and out of the core area. The at least one I/O cell includes a gate orientation, a pre-driver module, and at least one post-driver module. The pre-driver module and the at least one post-driver module are offset from each other by an angle between zero and ninety degrees with respect to the gate orientation. The gate orientation for every one of the at least one I/O cell is substantially the same.

20 Claims, 2 Drawing Sheets

INTEGRATED CIRCUIT HAVING INPUT/OUTPUT CELL ARRAY HAVING SINGLE GATE ORIENTATION

CROSS-REFERENCE TO RELATED APPLICATION

The present application claims priority of U.S. Provisional Patent Application No. 61/593,110, filed on Jan. 31, 2012, which is incorporated herein by reference in its entirety.

BACKGROUND

Integrated circuits (ICs) comprise at least one core area configured to perform the active functions of the IC and at least one input/output (I/O) cell configured to transfer signals into and out of the core area. In some instances, the IC includes I/O cells connected to each side of the core area. That is, for a rectangular core area, the IC includes one I/O cell along each of the four sides of the perimeter of the core area. To facilitate scaling of technology nodes, gate used to form the at least one I/O cell and the at least one core area is restricted to a single lattice orientation. The single gate orientation; however, creates problems with the routing of conductive lines between elements of the at least one I/O cell.

In some instances, a conductive line for the at least one I/O cell is formed in a serpentine pattern to connect the elements of the I/O cell. The serpentine pattern is complicated and time consuming to form and increases the size of the I/O cell to accommodate turns in the conductive line. Thus, the serpentine pattern increases production cost and time due to the complexity of the pattern, and the decreased IC size afforded by the single gate orientation is partially offset by the increase in the size of the I/O cell. The serpentine pattern also causes difficulty in connecting the at least one core area to the I/O cell because a minimum space between the serpentine conductive line and a conductive pin configured to electrically connect the core area and the I/O cell is maintained to reduce the risk of short circuits. The serpentine conductive line pattern also exacerbates electrostatic discharge concerns, which may permanently damage the IC, in some instances.

DESCRIPTION OF DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are of course, merely examples and are not intended to be limiting.

Figure 1:
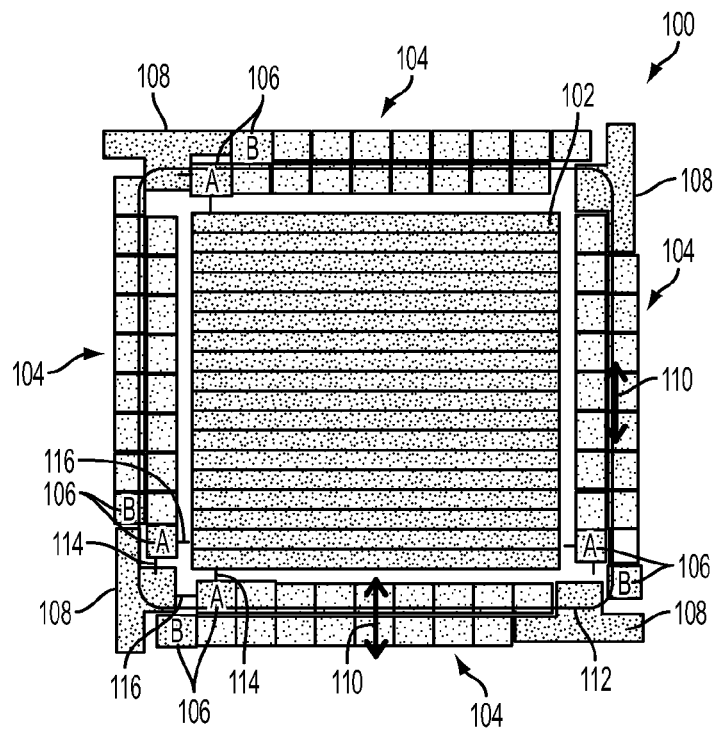
FIG. 1 is a top view of an integrated circuit (IC) including a modularized input/output (I/O) cell including two modules according to one or more embodiments.

FIG. 1 depicts an integrated circuit (IC) 100 having a core area 102 and input/output (I/O) rails 104. In some embodiments, IC 100 includes four I/O rails 104, one I/O rail 104 extending parallel to each side of at least one core area 102. In some embodiments, I/O rails 104 substantially form a perimeter around core area 102. IC 100 further includes corner spacers 108 positioned at an intersection of two I/O rails 104. Corner spacers 108 are arranged substantially at an exterior corner of core area 102. I/O rails 104 include I/O cells 106 and each I/O cell 106 is formed of at least two modules, A and B. FIG. 1 further depicts a gate orientation 110 of I/O rails 104. The gate orientation 110 of each I/O rail 104 is substantially the same. The gate orientation 110 of IC 100 is substantially vertical, as shown in FIG. 1. IC 100 further includes a conductive line 112 configured to electrically connect I/O rails 104 together.

By having the gate orientation 110 of each I/O rail 104 be substantially the same, the manufacturing process is simplified. For example, some etchants remove material along a certain lattice direction at a higher rate than other lattice directions. By having a uniform gate orientation, the manufacturing process is able to be implemented using a single etchant and the design process for photo masks is simplified in comparison to ICs having multiple gate orientations. IC 100 having the uniform gate orientation results in a higher yield than ICs having multiple gate orientations. In some embodiments, a gate of I/O rails comprises polysilicon, metal or other suitable gate material.

Core area 102 includes active elements configured to perform the functions of IC 100. In some embodiments, the active elements of core area 102 include transistors, switches, latches, or other suitable active elements. In some embodiments, IC 100 includes more than one core area 102. In some embodiments where IC 100 includes more than one core area 102, a circuit designer independently selects the function each core area 102 is configured to perform. In some embodiments having more than one core area 102, each core area 102 is coupled to a separate I/O rail 104. In some embodiments having more than one core area 102, separate core areas 102 are coupled to a shared I/O rail 104.

In some embodiments, each I/O cell 106 includes two modules. In some embodiments, each I/O cell 106 includes more than two modules.

Module A of I/O cell 106 comprises a pre-driver. In some embodiments, the pre-driver comprises a decoder, a level shifter, or other suitable devices. Module B of I/O cell 106 comprises at least one post-driver. In some embodiments, the at least one post-driver comprises an output buffer, a plurality of fingers, or other suitable devices. In some embodiments, module B includes an electrostatic discharge protection device.

In some embodiments, modules A and B have a 1:1 aspect ratio. In some embodiments, modules A and B have a same height as measured from a substrate beneath I/O rail 104 to a top of modules A and B. Modules A and B having the same height simplifies the design of I/O rails 104 in comparison with an I/O cell where modules A and B have different heights. The simplified design reduces production time and cost.

Modules A and B of I/O cell 106 are offset from one another, such that an imaginary line drawn through the center of each module A and B forms an angle of about 45-degrees with respect to gate orientation 110. In some embodiments, an absolute value of the angle between the offset of modules A and B and gate orientation 110 ranges from 0-degrees to 90-degrees, exclusive of the end points.

In some embodiments, module A is configured to electrically connect to core area 102 through a conductive pin 114 or 116. In some embodiments, module A includes more than one conductive pin 114 and 116. Including more than one conductive pin 114 and 116 in module A enables the circuit designer to repeat substantially the same I/O cell structure for each of the I/O rails 104 in IC 100. For example, module A, in some embodiments, includes conductive pin 114 protruding from a top surface of module A and conductive pin 116 protruding from a left hand surface, as depicted in FIG. 1, of module A. In I/O rail 104 extending along a bottom of core area 102, as depicted in FIG. 1, conductive pin 114 protruding from the top surface of module A is configured to electrically connect to core area 102. In I/O rail 104 extending along a left side of core area 102, as depicted in FIG. 1, conductive pin 116 protruding from the left hand surface of module A is configured to electrically connect to core area 102. The ability to repeat substantially the same I/O rail 104 structure reduces design complexity and production cost.

Corner spacers 108 are positioned at each intersection of I/O rails 104. Corner spacers 108 are non-rectangular in shape. In some embodiments, corner spacers 108 have a step shape. In some embodiments, corner spacers 108 have a pyramidal shape or other suitable shape. Corner spacers 108 include conductive connections for connection to a power supply and a ground for IC 100. In some embodiments, corner spacers 108 are formed integral with I/O rails 104, such that each I/O rail includes a corner spacer. In some embodiments, corner spacers 108 do not include circuitry. In some embodiments, corner spacers 108 include circuitry. In some embodiments, corner spacers 108 include stress relief patterns configured to reduce the risk of cracking of a chip supporting IC 100.

IC 100 further includes conductive line 112 configured to electrically connect I/O rails 104 together. In some embodiments, conductive line 112 comprises aluminum, copper, gold or other suitable conductive materials. In some embodiments, conductive line is a rectangular shape with rounded corners. The shape of conductive line 112 is less complex and easier to produce than serpentine shaped conductive lines. The shape of conductive line 112 also avoids increasing the size of I/O rails 104 to accommodate curves in the conductive line because the curves occur in corner spacers 108. In some embodiments, conductive line 112 is a substantially constant distance from core area 102. Thus, the shape of conductive line 112 simplifies the spacing between the conductive pin of I/O cells 106 and conductive line 112. In some embodiments, conductive line 112 is not a substantially constant distance from core area 102.

IC 100 further includes a bonding pad, which is configured to electrically connect I/O cell 106 to conductive line 112. In some embodiments, the bonding pad is configured to electrically connect to I/O cell 106 at module A. In some embodiments, the bonding pad is configured to electrically connect to I/O cell 106 at module B. In some embodiments, the bonding pad is configured to electrically connect to I/O cell 106 at a junction of modules A and B. In some embodiments, I/O cell 106 is electrically connected to more than one bonding pad. In some embodiments, the bonding pad is a copper pillar, solder bump, or other suitable electrical connection structure.

Figure 2:
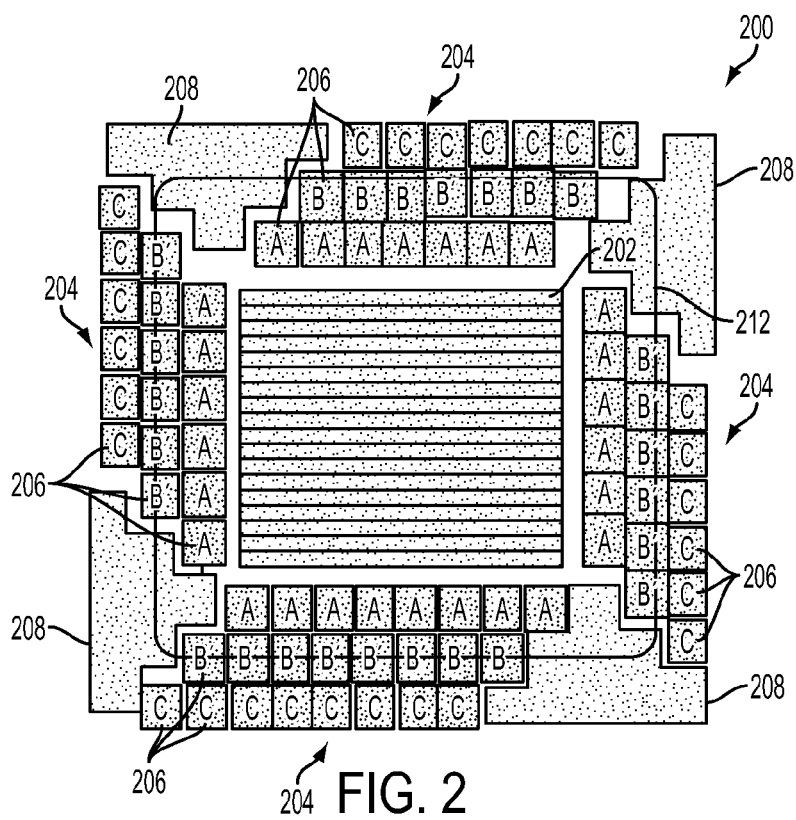
FIG. 2 is a top view of an IC including a modularized I/O cell including three modules according to one or more embodiments.

FIG. 2 depicts an IC 200 having a core area 202 and I/O rails 204. In some embodiments, IC 200 includes four I/O rails 204, one I/O rail 204 each extending parallel to one side of at least one core area 202. In some embodiments, I/O rails 204 substantially form a perimeter around core area 202. IC 200 further includes corner spacers 208 positioned at an intersection of two I/O rails 204. Corner spacers 208 are arranged substantially at an exterior corner of core area 202. I/O rails 204 include I/O cells 206 and each I/O cell 206 is formed of three modules A, B' and C. Gate orientation of each I/O cell 206 is substantially the same. IC 200 further includes a conductive line 212 configured to electrically connect I/O rails 204 together.

In some embodiments, core area 202 of IC 200 is substantially the same as core area 102 of IC 100. In some embodiments, corner spacer 208 of IC 200 is substantially the same as corner spacer 108 of IC 100. In some embodiments, IC 200 includes multiple conductive pins in a manner substantially the same as IC 100. In some embodiments, conductive line 212 is substantially the same as conductive line 112 of IC 100.

I/O rails 204 of IC 200 include I/O elements 206 having three modules A, B' and C. In some embodiments, module A of I/O cell 206 is substantially the same as module A of I/O cell 106. In some embodiments, module B of I/O cell 106 is split to form modules B' and C of I/O cell 206. In some embodiments, module B' includes devices containing p-type metal oxide semiconductor (PMOS) transistors of post-driver module B of I/O cell 106. In some embodiments, module C includes devices containing n-type metal oxide semiconductor (NMOS) transistors of post-driver module B of I/O cell 106.

In some embodiments, modules A, B' and C have a 1:1 aspect ratio. In some embodiments, modules A, B' and C have a same height as measured from a substrate beneath I/O cell 206 to a top of modules A, B' and C. Modules A, B' and C having the same height simplifies the design of I/O cells 206 in comparison with an I/O cell where modules A, B' and C have different heights. The simplified design reduces production time and cost.

Modules A, B' and C of I/O cell 206 are offset from one another, such that an imaginary line drawn through the center of each module A, B' and C forms an angle of about 45-degrees with respect to the gate orientation of IC 200. In some embodiments, an absolute value of the angle between the offset of modules A, B' and C and the gate orientation of IC 200 ranges from 0-degrees to 90-degrees, exclusive of the end points.

IC 200 further includes a bonding pad, which is configured to electrically connect I/O cell 206 to conductive line 212. In some embodiments, the bonding pad is configured to electrically connect to I/O cell 206 at module A. In some embodiments, the bonding pad is configured to electrically connect to I/O cell 206 at module B'. In some embodiments, the bonding pad is configured to electrically connect to I/O cell 206 at module C. In some embodiments, the bonding pad is configured to electrically connect to I/O cell 206 at a junction of modules A and B'. In some embodiments, the bonding pad is configured to electrically connect to I/O cell 206 at a junction of modules B' and C. In some embodiments, I/O cell 206 is electrically connected to more than one bonding pad.

Figure 3A:
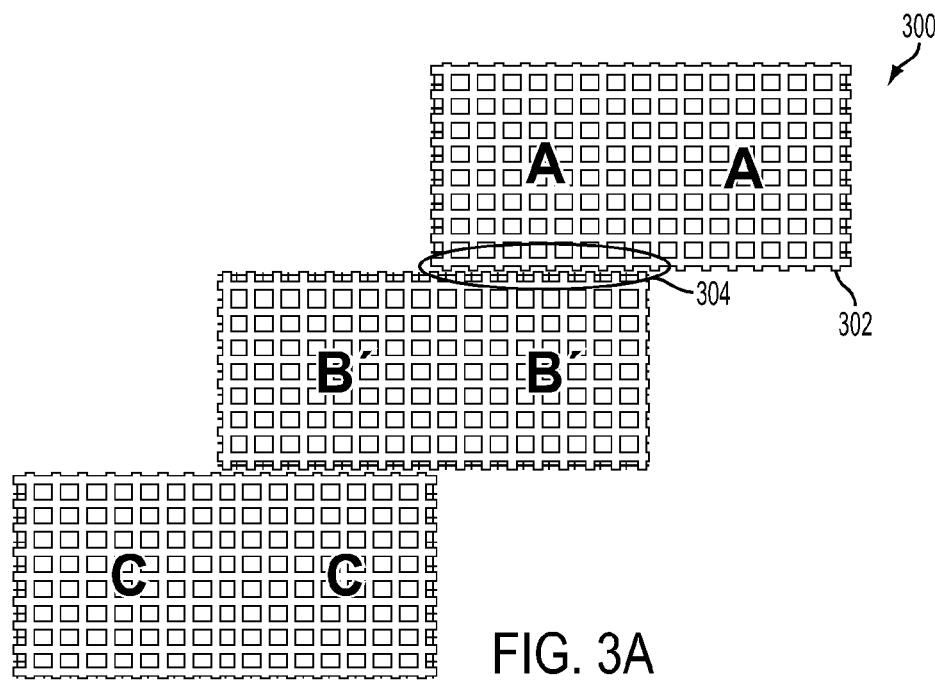
FIGS. 3A and 3B are top views of a power grid arrangement between modules of a modularized I/O cell according to one or more embodiments.

FIG. 3A depicts an arrangement 300 of power and ground lines 302 for modules A, B' and C for IC 200. Arrangement 300 substantially resembles a layout of modules A, B' and C along a top and bottom of IC 200, as shown in FIG. 2. Power and ground lines 302 for each type of module, i.e., A, B' or C, are offset from the power and ground lines of a neighboring type of module. In arrangement 300, power and ground lines 302 of module A are offset with respect to the power and ground lines of module B'. Similarly, power and ground lines 302 of module B' are offset with respect to the power and ground lines of module C. The offset of the power and ground lines 302 of different type of modules reduces the risk of short circuits at an interface 304 where different module types abut one another.

Figure 3B:
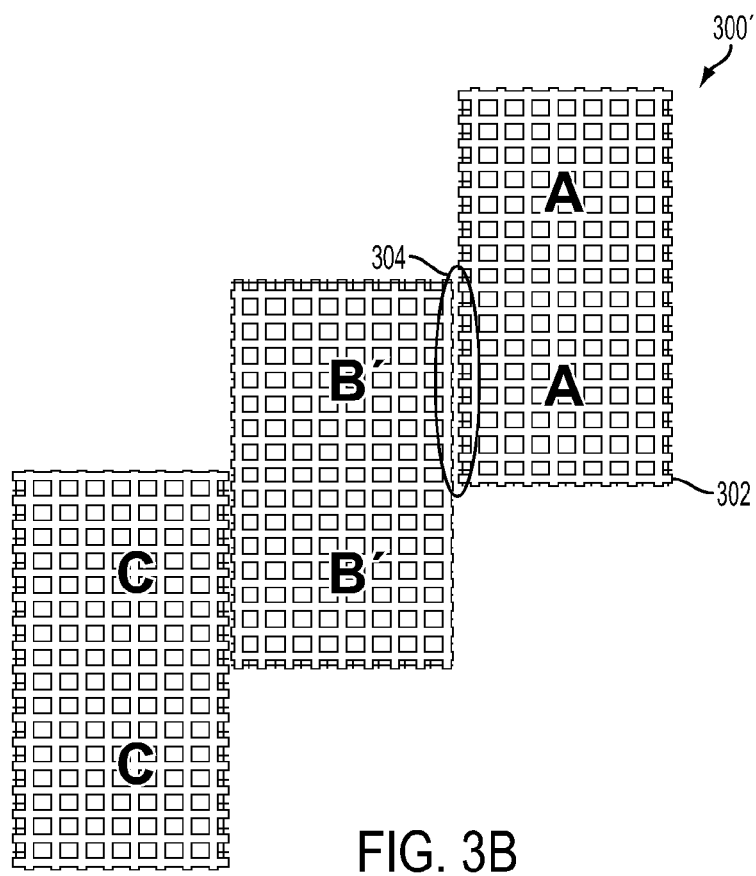

FIG. 3B depicts an arrangement 300' of power and ground lines 302 for modules A, B' and C for IC 200. Arrangement 300' substantially resembles a layout of modules A, B' and C along a left and right of IC 200, as shown in FIG. 2. Similar to arrangement 300, in arrangement 300' power and ground lines 302 for each type of module, i.e., A, B' or C, are offset from the power and ground lines of a neighboring type of module. The offset of power and ground lines 302 of different type of modules reduces the risk of short circuits at an interface 304' where different module types abut one another.

One aspect of this description relates to an integrated circuit (IC) including a core area comprising active devices; and at least one input/output (I/O) cell configured to transfer signals into and out of the core area, wherein each of the at least one I/O cell includes a gate orientation, a pre-driver module, and at least one post-driver module, where the pre-driver module and the at least one post-driver module are offset from each other by an angle between zero and ninety degrees with respect to the gate orientation, and the gate orientation for every one of the at least one I/O cell is substantially the same.

Another aspect of this description relates to an input/output (I/O) cell including a gate orientation, a pre-driver module, and at least one post-driver module, where the pre-driver module and the at least one post-driver module are offset from each other by an angle between zero and ninety degrees with respect to the gate orientation, and the gate orientation for every one of the at least one I/O cell is substantially the same.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit (IC) comprising:
    a core area comprising one or more active devices; and
    at least one input/output (I/O) cell configured to transfer signals into and out of the core area, wherein each of the at least one I/O cell comprises:
        a pre-driver module, and
        at least one post-driver module,
    wherein the pre-driver module and the at least one post-driver module are offset from each other by an angle between zero and ninety degrees with respect to the gate orientation, and
    a gate orientation of every one of the at least one I/O cell is the same.

2. The IC of claim 1, further comprising at least one corner spacer, wherein the at least one corner spacer has a shape other than a rectangular shape.

3. The IC of claim 2, wherein the at least one corner spacer has a step-shape or pyramidal shape.

4. The IC of claim 1, wherein each of the at least one I/O cell comprises a first post-driver module and a second post-driver module.

5. The IC of claim 4, wherein the first post-driver module comprises at least one p-type metal oxide semiconductor transistor and the second post-driver module comprises at least one n-type metal oxide semiconductor transistor.

6. The IC of claim 1, wherein the angle is about 45-degrees.

7. The IC of claim 1, wherein an aspect ratio of the pre-driver and the at least one post-driver is 1:1.

8. The IC of claim 1, further comprising:
    first power and ground lines configured to electrically connect to the pre-driver; and
    second power and ground lines configured to connect to one of the at least one post-driver,
    wherein the first power and ground lines are offset with respect to the second power and ground lines.

9. The IC of claim 1, further comprising a bonding pad configured to electrically connect to at least one of the pre-driver or the at least one post-driver.

10. The IC of claim 1, wherein the pre-driver comprises more than one conductive pin configured to electrically connect the at least one I/O cell to the core area.

11. An input/output (I/O) cell comprising:
    a pre-driver module, and
    at least one post-driver module,
    wherein the pre-driver module and the at least one post-driver module are offset from each other by an angle between zero and ninety degrees with respect to a gate orientation, and the gate orientation of every one of the at least one I/O cell is the same.

12. The I/O cell of claim 11, further comprising at least one corner spacer, wherein the at least one corner spacer has a shape other than a rectangular shape.

13. The I/O cell of claim 12, wherein the at least one corner spacer has a step-shape or pyramidal shape.

14. The I/O cell of claim 11, wherein the at least one post-driver comprises a first post-driver module and a second post-driver module.

15. The I/O cell of claim 14, wherein the first post-driver module comprises at least one p-type metal oxide semiconductor transistor and the second post-driver module comprises at least one n-type metal oxide semiconductor transistor.

16. The I/O cell of claim 11, wherein the angle is about 45-degrees.

17. The I/O cell of claim 1, wherein an aspect ratio of the pre-driver and the at least one post-driver is 1:1.

18. The I/O cell of claim 11, further comprising power and ground lines configured to electrically connect to the pre-driver; and
    power and ground lines configured to electrically connect to the at least one post-driver,
    wherein the power and ground lines connected to the pre-driver are offset with respect to the power and ground lines connected to the at least one post-driver.

19. The I/O cell of claim 11, further comprising a bonding pad configured to electrically connect to at least one of the pre-driver or the at least one post-driver.

20. The I/O cell of claim 11, wherein the pre-driver comprises more than one conductive pin configured to electrically connect the I/O cell to a core area comprising active devices.

* * * * *